(12) United States Patent
McBride et al.

(10) Patent No.: US 6,308,301 B1
(45) Date of Patent: Oct. 23, 2001

(54) SYSTEM AND METHOD FOR DETECTING MULTIPLEXERS IN A CIRCUIT DESIGN

(75) Inventors: John G McBride, Ft Collins; Jan Kok, Fort Collins, both of CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/358,317

(22) Filed: Jul. 21, 1999

(51) Int. Cl.[7] .................................................. G06F 17/50
(52) U.S. Cl. ......................................................... 716/4
(58) Field of Search ........................................ 716/4, 1, 6

(56) References Cited

U.S. PATENT DOCUMENTS

| | | | |
|---|---|---|---|
| 5,553,008 | * 9/1996 | Huang et al. | 364/578 |
| 5,629,858 | * 5/1997 | Kundu et al. | 364/488 |
| 5,740,347 | * 4/1998 | Avidan | 395/183.09 |
| 5,796,990 | * 8/1998 | Erle et al. | 395/500 |
| 6,249,899 | * 6/2001 | McBride et al. | 716/4 |

* cited by examiner

Primary Examiner—Matthew Smith
Assistant Examiner—Leigh Marie Garbowski (57) ABSTRACT

The present invention is directed to a system and method for identifying multiplexers from a netlist. In accordance with one aspect of the invention, a method identifies multiplexers from a netlist by identifying both an input node and an output node of a pass gate. The method then identifies all FETs that are channel connected to the output node, and evaluates all FETs that are identified as being channel connected to the output node, to determine whether they are pass FETs. Finally, the method determines whether at least one of the identified pass FETs has an output that is the same node as the output node and an input that is not the same node as the input node. In accordance with another aspect of the invention, the method identifies a node in the netlist that is an output node of a first pass FET and identifies at least one other pass FET that has an output that is the same node as the output node. Finally, the method evaluates the at least one other pass FET to determine whether an input of that other at least one other pass FET is not the same node as an input node of the first pass FET.

18 Claims, 9 Drawing Sheets

ELEMENT { ~~~~
~~~~

Complementary Pass FET
RAM Pass FET
Single Pass FET
~~~~~~

~~~~~~

Direction: Unset, Bidirectional, Source-to-Drain,
           Drain-to-Source
~~~~~~}

FIG. 4A

NODE { ~~~~
~~~~

Output
~~~~~~

~~~~~~

Mux Output
~~~~~~}

SYSTEM AND METHOD FOR DETECTING MULTIPLEXERS IN A CIRCUIT DESIGN

BACKGROUND OF THE INVENTION

1. Field of the Invention

The present invention generally relates to computer-aided circuit design systems, and more particularly to a system and method for evaluating a netlist of an integrated circuit to identify multiplexers.

2. Discussion of the Related Art

Integrated circuits are electrical circuits comprised of transistors, resistors, capacitors, and other components on a single semiconductor "chip" in which the components are interconnected to perform a given function such as a microprocessor, programmable logic device (PLD), electrically erasable programmable memory (EEPROM), random access memory (RAM), operational amplifier, or voltage regulator. A circuit designer typically designs the integrated circuit by creating a circuit schematic indicating the electrical components and their interconnections. Often, designs are simulated by computer to verify functionality and ensure performance goals are satisfied.

In the world of electrical device engineering, the design and analysis work involved in producing electronic devices is often performed using electronic computer aided design (E-CAD) tools. As will be appreciated, electronic devices include electrical analog, digital, mixed hardware, optical, electro-mechanical, and a variety of other electrical devices. The design and the subsequent simulation of any circuit board, VLSI chip, or other electrical device via E-CAD tools allows a product to be thoroughly tested and often eliminates the need for building a prototype. Thus, today's sophisticated E-CAD tools may enable the circuit manufacturer to go directly to the manufacturing stage without costly, time consuming prototyping.

In order to perform the simulation and analysis of a hardware device, E-CAD tools must deal with an electronic representation of the hardware device. A "netlist" is one common representation of a hardware device. As will be appreciated by those skilled in the art of hardware device design, a "netlist" is a detailed circuit specification used by logic synthesizers, circuit simulators and other circuit design optimization tools. A netlist typically comprises a list of circuit components and the interconnections between those components.

The two forms of a netlist are the flat netlist and the hierarchical netlist. Often a netlist will contain a number of circuit "modules" which are used repetitively throughout the larger circuit. A flat netlist will contain multiple copies of the circuit modules essentially containing no boundary differentiation between the circuit modules and other components in the device. By way of analogy, one graphical representation of a flat netlist is simply the complete schematic of the circuit device.

In contrast, a hierarchical netlist will only maintain one copy of a circuit module which may be used in multiple locations. By way of analogy, one graphical representation of a hierarchical netlist would show the basic and/or non-repetitive devices in schematic form and the more complex and/or repetitive circuit modules would be represented by "black boxes." As will be appreciated by those skilled in the art, a black box is a system or component whose inputs, outputs, and general function are known, but whose contents are not shown. These "black box" representations, hereinafter called "modules", will mask the complexities therein, typically showing only input/output ports.

An integrated circuit design can be represented at different levels of abstraction, such as the Register-Transfer level (RTL) and the logic level, using a hardware description language (HDL). VHDL and Verilog are examples of HDL languages. At any abstraction level, an integrated circuit design is specified using behavioral or structural descriptions or a mix of both. At the logical level, the behavioral description is specified using Boolean equations. The structural description is represented as a netlist of primitive cells. Examples of primitive cells are full-adders, NAND gates, latches, and D-Flip Flops.

Having set forth some very basic information regarding the representation of integrated circuits and other circuit schematics through netlists, systems are presently known that use the information provided in netlists to evaluate circuit timing and other related parameters. More specifically, systems are known that perform a timing analysis of circuits using netlist files. Although the operational specifics may vary from system to system, generally such systems operate by identifying certain critical timing paths, then evaluating the circuit to determine whether timing violations may occur through the critical paths. As is known, timing specifications may be provided to such systems by way of a configuration file.

One such system known in the prior art is marketed under the name PathMill, by EPIC Design Technology, Inc. (purchased by Synopsys). PathMill is a transistor-based analysis tool used to find critical paths and verify timing in semiconductor designs. Using static and mixed-level timing analysis, PathMill processes transistors, gates, and timing models. It also calculates timing delays, performs path searches, and checks timing requirements. As is known, PathMill can analyze combinational designs containing gates, and sequential designs containing gates, latches, flip-flops, and clocks. Combinational designs are generally measured through the longest and shortest paths.

While tools such as these are useful for the design verification process after layout, there are various shortcomings in the PathMill product and other similar products. For example, there is often a need to identify certain logic gates or particular combinations of logic gates. More specifically, there is sometimes a need to identify combinations of gates that are configured in such a manner that may lead to operational uncertainty or performance problems. By way of particular example, it is generally desirable to avoid designing a circuit, whereby more than one gate drives a common node. Such a configuration usually results in "drive fights" or other deleterious results. Of course, there are exceptions to this general design constraint. Indeed, multiple gates may drive a common node, so long as design constraints are imposed so that (generally) no more than one of the gates will drive the node at any given time.

For example, multiplexers are characterized by a design configuration having a plurality of output gates that are configured to drive a single output. As is known, a multiplexer is a common circuit element that is designed to select among a plurality of inputs, and direct a "selected" input to a single output. By virtue of the logic that comprises the selection circuitry within the multiplexer, the device is configured so that only one gate drives the common output node at any given time.

Therefore, it is desirable to provide a method and apparatus that is designed to identify (from a schematic or netlist) gates configured to operate as a multiplexer. More specifically, in a system that evaluates a circuit netlist for potential design errors, including a plurality of gates driving a common node, it is desirable to identify gates configured to operate as a multiplexer, and exempt any such configuration from being identified as a design error within the circuitry.

Accordingly, there is a heretofore unaddressed need to provide a design tool that evaluates a netlist or other electronic file representative of an electronic circuit to identify circuit configurations that form or operate as multiplexers.

SUMMARY OF THE INVENTION

Certain objects, advantages and novel features of the invention will be set forth in part in the description that follows and in part will become apparent to those skilled in the art upon examination of the following or may be learned with the practice of the invention. The objects and advantages of the invention may be realized and obtained by means of the instrumentalities and combinations particularly pointed out in the appended claims.

To achieve the advantages and novel features, the present invention is generally directed to a system and method for identifying multiplexers from a netlist. In accordance with one aspect of the invention, a method identifies multiplexers from a netlist by identifying both an input node and an output node of a pass gate. The method then identifies all FETs that are channel connected to the output node, and evaluates all FETs that are identified as being channel connected to the output node, to determine whether they are pass FETs. Finally, the method determines whether at least one of the identified pass FETs has an output that is the same node as the output node and an input that is not the same node as the input node.

In accordance with another aspect of the invention, the method identifies a node in the netlist that is an output node of a first pass FET and identifies at least one other pass FET that has an output that is the same node as the output node. Finally, the method evaluates the at least one other pass FET to determine whether an input of that other at least one other pass FET is not the same node as an input node of the first pass FET.

In accordance with another aspect of the invention, a computer readable medium is provided having program code for controlling a system to identify a circuit configured as a multiplexer by evaluating a netlist. In one implementation, the computer readable medium includes a first code segment configured to identify a node in the netlist that is an output node of a first pass FET. The computer readable medium also includes a second code segment configured to identify at least one other pass FET that has an output that is the same node as the output node. Finally, the computer readable medium includes a third code segment configured to evaluate the at least one other pass FET to determine whether an input of that other at least one other pass FET is not the same node as an input node of the first pass FET.

DESCRIPTION OF THE DRAWINGS

The accompanying drawings incorporated in and forming a part of the specification, illustrate several aspects of the present invention, and together with the description serve to explain the principles of the invention. In the drawings.

DETAILED DESCRIPTION OF THE PREFERRED EMBODIMENT

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

Figure 1:
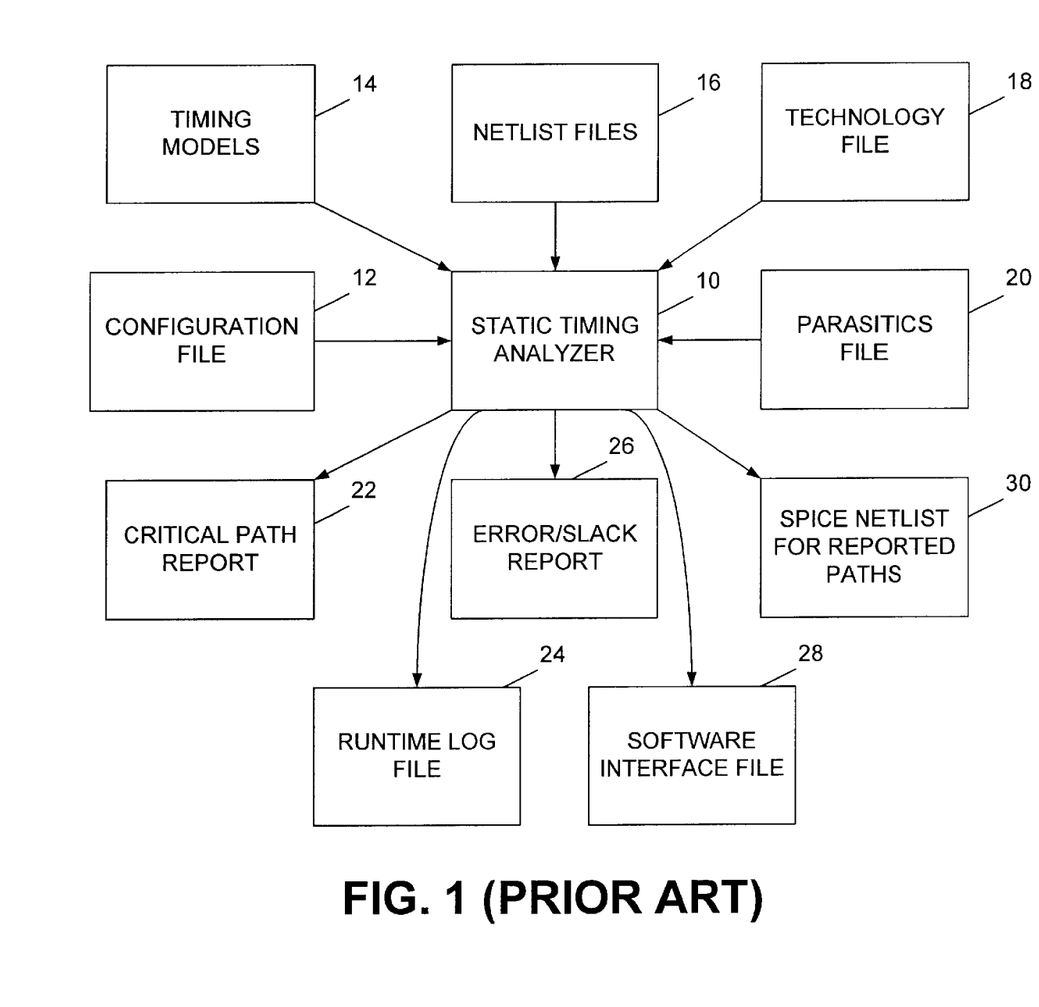
FIG. 1 is a block diagram of a static timing analyzer system, as is known in the prior art.

Referring now to the drawings, reference is made to FIG. 1, which is a block diagram of a prior art static timing analyzer program that illustrates the basic informational flow in such a system. Specifically, and as previously mentioned, one such system is marketed under the name PathMill. FIG. 1 is a diagram that illustrates the informational flow in the PathMill system. At the center of the diagram is a block denoted as Static Timing Analyzer 10, which represents the PathMill program. Surrounding this block 10 are a number of other blocks that represent various input and output files and/or information.

More particularly, the PathMill program may utilize a configuration file 12, a file of timing models 14, one or more netlist files 16, a technology file 18, and a parasitics file 20, for various input information. In addition, the PathMill program may generate a number of different output files or other output information, including a critical path report 22, a runtime log file 24, an error report 26, a software interface file 28, and a SPICE netlist 30. When started, the PathMill program first processes the input netlist file(s) 16, the technology file 18, and the configuration files 12. The information from these files is subsequently used for performing path analyses. Since the PathMill program is publicly available and marketed, its function and operation are well known, and therefore need not be discussed in detail herein.

For purposes of illustrating the present invention, much of the diagram and information illustrated in FIG. 1 is not shown in connection with the inventive system. In this regard, reference is made to FIG. 2, which shows one embodiment of a system constructed in accordance with the present invention. In the illustrated embodiment, only the static timing analyzer 10, the configuration file 12 and the netlist file 16 of FIG. 1 are shown. The configuration file(s) 12 contains information that informs the static timing analyzer 10 how to perform its analysis, and various numbers of configuration files may be used. The netlist file 16, as is known, defines the various integrated circuit components, and their interrelations. The static timing analyzer 10 may make its internal database or netlist available to the electrical rules checker, which in turn may generate a binary file output 106

Figure 2:
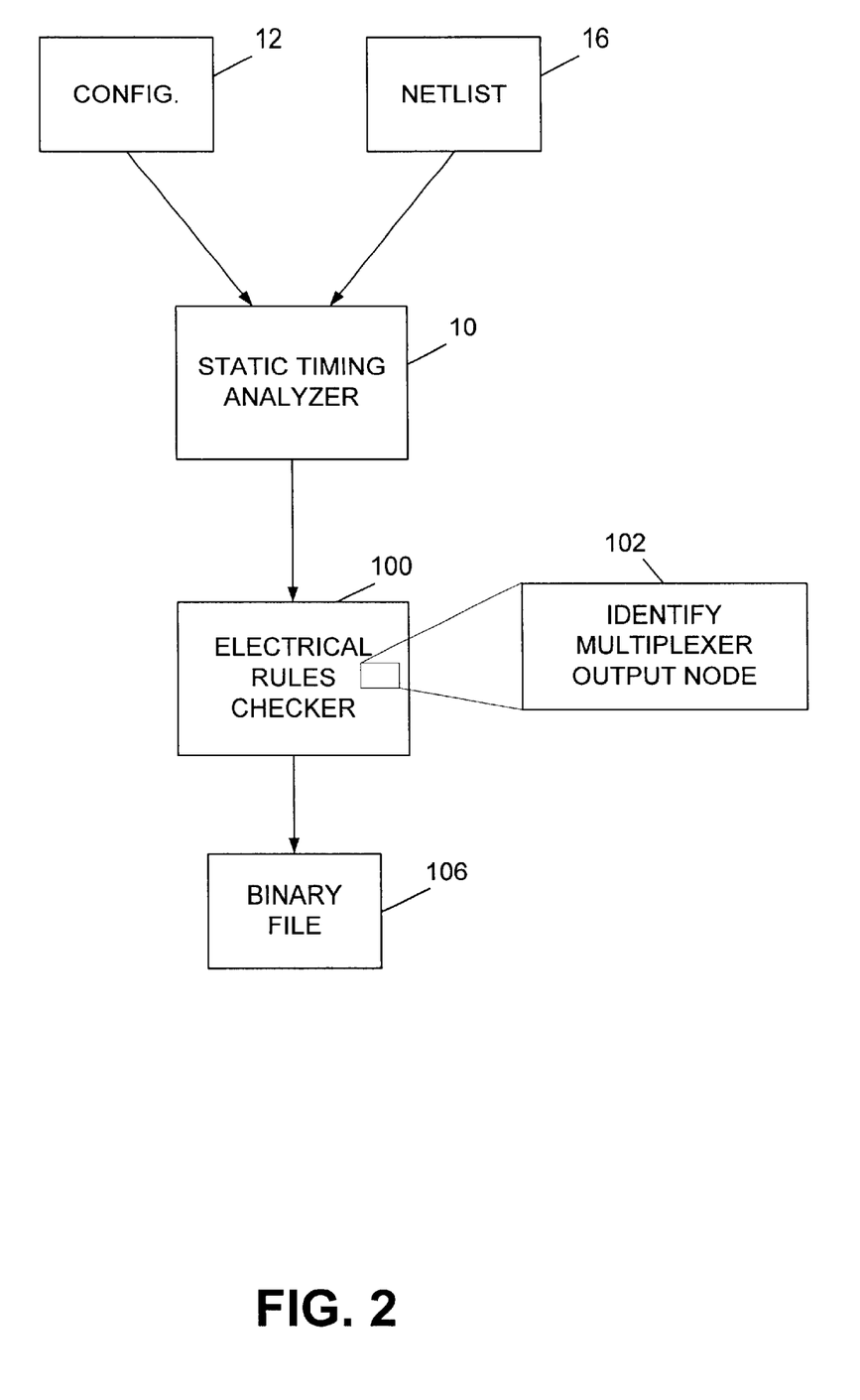
FIG. 2 is a block diagram illustrating the orientation of the electrical rules checking method of the present invention, in relation to an existing static timing analyzer.

The electrical rules checker 100 program of the present invention is preferably configured to operate on an output of the static timing analyzer 10. In this regard, the static timing analyzer may be configured to generate an output netlist database, which the electrical rules checker of the present invention utilizes as an input. As previously mentioned, there are a wide variety of reasons why an electrical rules checking program may be desired. One such reason is to perform various checks over certain rules or strategies in an integrated circuit design. Such rules may vary from circuit to circuit, depending upon the particular application. A portion 102 of the electrical rules checker program 100 of the preferred embodiment of the present invention operates to identify a circuit configuration of a multiplexer. The identification of such a circuit configuration may be used to exempt an error message (or warning) that would otherwise be generated upon detecting multiple gates configured to drive a common node.

As is known, a large scale integrated circuit design is often done at the FET level. A designer may utilize thousands of interconnected FETs in designing a portion of an integrated circuit. Although the designer may make every effort to follow certain design guidelines, mistakes may nevertheless be made. Accordingly, the electrical rules checker of the present invention provides an excellent mechanism for double-checking designs and design layouts.

In keeping with the description of FIG. 2, the electrical rules checker 100 of the present invention may generate an output binary file 106, which may ultimately be used in subsequent executions of the electrical rules checker program 100.

However, prior to the electrical rules checker 100 of the present invention performing any of the rules checking tasks, a database of nodes and elements of the circuit to be evaluated is generated. This database is then utilized by the electrical rules checker 100 of the present invention to perform the rules checking tasks. However, it should be noted that the database and the method in which it is generated is not limited to use with any particular rules checker. They may be used with virtually any type of rules checker which evaluates nodes for design quality. For example, the database of the present invention may also be used with rules checkers which evaluate nodes for optical computing systems, mechanical systems and chemical systems. It will be apparent to those skilled in the art how data structures similar to those generated for elements and nodes in the electrical context may be generated in mechanical, chemical and optical computing contexts and used for rules checking in those contexts.

The manner in which this database is generated will now be discussed below with respect to FIGS. 3A–3C. For purposes of illustration, it will be assumed that the static timing analyzer 10, shown in FIG. 2 and discussed above, is the PathMill static timing analyzer, in order to provide an example of one possible implementation of the present invention. However, those skilled in the art will understand that the electrical rules checker 100 of the present invention and the database of the present invention are not limited to use with any particular program.

The PathMill static timing analyzer provides an application program interface (API) which allows the PathMill static timing analyzer to communicate with the electrical rules checker 100 of the present invention. This API allows code external to the PathMill program to be linked to the PathMill program so that the external code and the PathMill program itself comprise one executable which can be run as a single program. The electrical rules checker 100 of the present invention utilizes this API to obtain information from the PathMill static timing analyzer which can be utilized by the electrical rules checker 100 to generate the database of the present invention, as indicated by block 102.

Prior to the database of the present invention being generated, the PathMill program runs and identifies circuit characteristics of the circuit under consideration such as, for example, FET direction, node types, latches, dynamic gates, clocks, rise and fall times, etc. Before the PathMill program terminates, it calls the electrical rules checker 100 of the present invention. The PathMill program has a feature commonly referred to as "hooks", which allows the PathMill program to call routines at various stages of execution. Once the PathMill program has finished identifying the characteristics mentioned above, the PathMill program calls the electrical rules checker 100 of the present invention. The electrical rules checker 100 of the present invention, through this series of subroutine calls, creates its own database of the circuit under consideration.

Figure 3A:
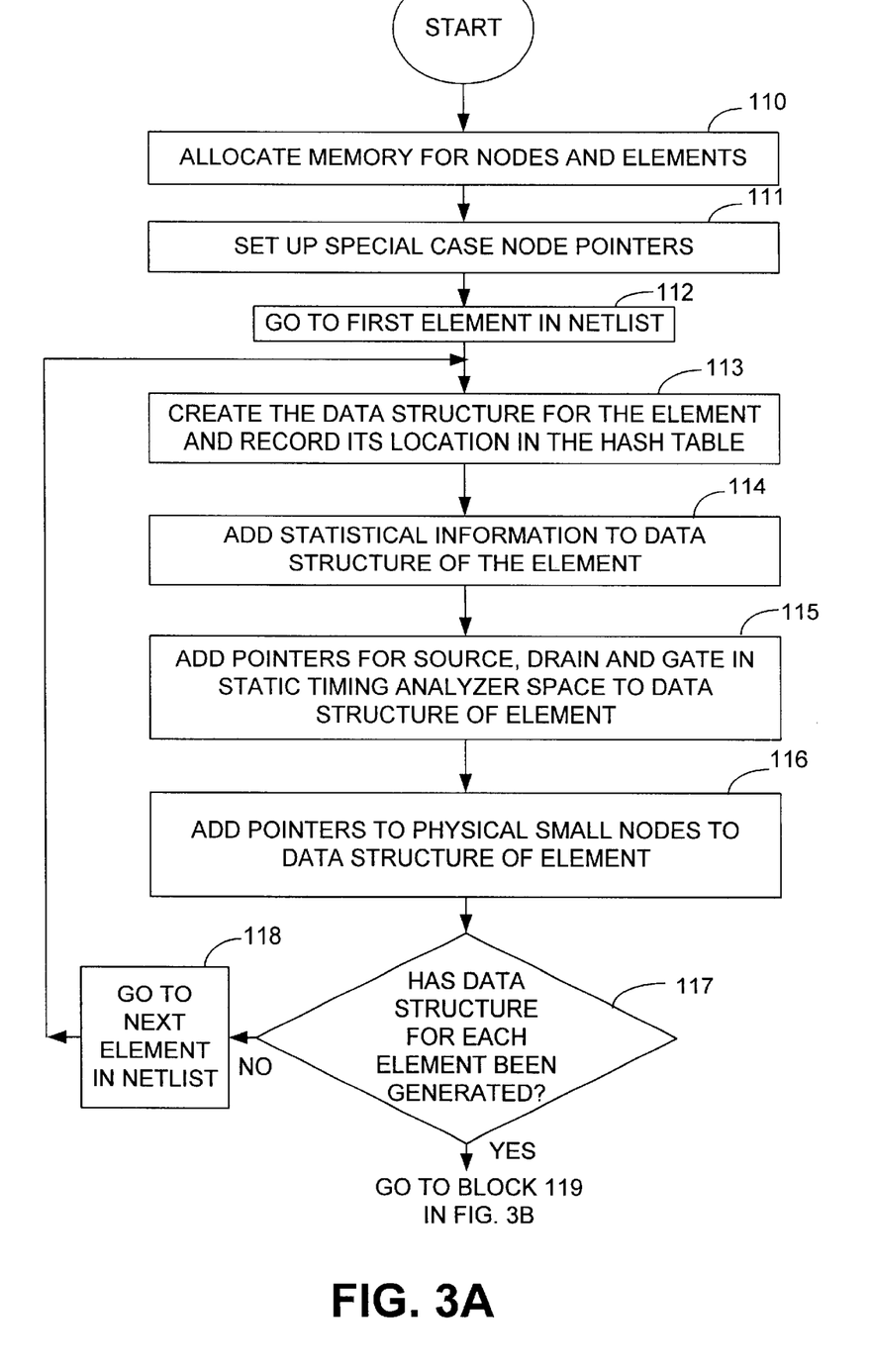
FIGS. 3A–3C collectively depict a flowchart that illustrates a process of generating a database of certain circuit element and node characteristics and properties that my be utilized by the preferred embodiment of the present invention to identify nodes susceptible to floating.
Figure 3B:
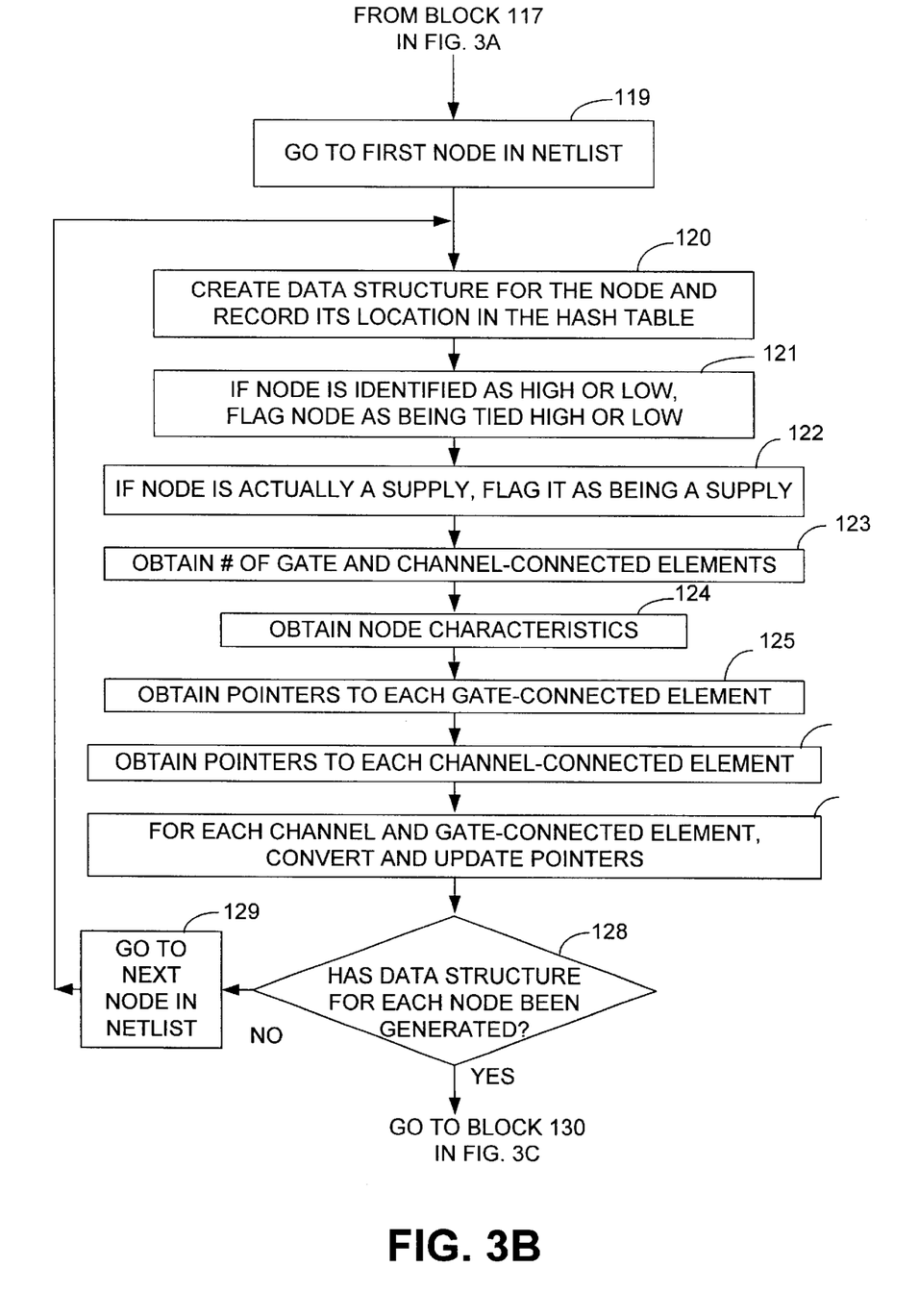

The first step in the process of generating the database is to allocate memory for the nodes and elements of the circuit, as indicated by block 110 in FIG. 3A. The PathMill program provides information via its API about the number of elements and nodes in the circuit of the electrical rules checker 100 and this information is utilized by the electrical rules checker 100 to perform memory allocation. Certain types of nodes and elements do not require as much information about their characteristics as do other types of nodes and elements. Therefore, the amount of memory allocated may vary for different types of nodes and elements. Rather than merely basing memory allocation on the number of nodes and elements in the circuit, it may be desirable to distinguish between different types of nodes and elements so that memory can be more efficiently allocated. However, it will be apparent to those skilled in the art that the present invention is not limited with respect to the manner in which memory space is allocated for the nodes and elements. Those skilled in the art will understand the manner in which the memory allocation task, and any optimizations of it, can be performed. Therefore, in the interest of brevity, a detailed discussion of the memory allocation task for the nodes and elements will not be provided herein.

Once memory has been allocated for the nodes and elements, the next step in the process of the present invention is to set up node pointers for special cases of nodes, as indicated by block 111. These special types of nodes will be used repeatedly during the process of generating the database, as discussed below in more detail. Therefore, the pointers for these nodes preferably are set up relatively early in the database generation process. For example, nodes which correspond to the supplies (GND and VDD) are special types of nodes and it is helpful to set up node pointers for these types of nodes. This is done by finding the nodes whose names match the known names of the supply nodes.

For each element, a data structure must be generated which can be utilized by the electrical rules checker 100 in performing the rules checking tasks. Steps 113–116 in FIG. 3A correspond to the steps for creating the element data structures. The first element for which a data structure must be generated is obtained during the step represented by block 112. The data structure for that element is then generated and the location of the data structure is recorded in a hash table, as indicated by block 113. This step is performed so that the element pointers into the space of the static timing analyzer can be used later to look up the element data structures in the space of the electrical rules checker 100. Hash tables and the manner in which they are utilized are well-known in the art. Therefore, a detailed discussion of the manner in which the pointers into the space of the static timing analyzer are converted using the hash table into pointers into the space of the electrical rules checker 100 will not be provided herein since persons skilled in the art will understand the manner in which this can be accomplished.

Statistical information relating to the element is then added to the data structure of the element, as indicated by block 114. This information includes, for example, the width of the element, the length of the element, the direction of the element, and the element type. Once the statistical information has been included in the data structure of the element, the pointers for the source, drain and gate of the element, as defined in the space of the static timing analyzer, are included in the data structure of the element, as indicated by block 115. The pointers that were set up in step 111 are utilized in step 115. If either the source, drain or gate of the element is attached to ground or VDD, then the pointers for the source, drain and gate are set to the pointers for ground or VDD obtained in step 111.

A circuit and the nodes of the circuit can be represented logically or physically, or as a combination of both. A logical representation of a circuit primarily comprises FETs and does not include any resistors for representing parasitic resistance of the interconnect material. The logical representation of a node is identified in the PathMill program as a "supernode". On the other hand, a physical representation of a node, which is identified in the PathMill program as a "small node", includes FETs, but also includes resistors, which correspond to the parasitic resistance in the node. Therefore, in the physical representation, a small node exists between the resistors representing the parasitic resistance and between any FET and any one of the resistors. In the physical representation, FETs may be connected to different small nodes whereas in the logical representation, those same FETs may be connected to the same supernode.

Each element has a pointer to a supernode and to a small node for each drain, source and gate. Therefore, there are six pointers for each FET. Each small node in the physical representation maps to one particular supernode in the logical representation. In block 116, the pointers corresponding to these small nodes are added to the data structure of the element. A determination is then made at block 117 as to whether or not data structures for all of the elements have been generated. If not, the next element in the netlist is obtained, as indicated by block 118, and the process returns to block 113. If so, the process proceeds to block 119 in FIG. 3B.

Once the data structures for the elements have been generated, the data structures for the nodes must be generated. Blocks 120–127 in FIG. 3B correspond to the steps in the process of the present invention for generating the data structures of the nodes. The first node for which the data structure is to be generated is obtained at the step represented by block 119. The data structure for the node is then generated and the location of the data structure is recorded in the hash table, as indicated by block 120.

For the purpose of design quality analysis, it is important to distinguish actual supply nodes, such as VDD and GND, from other circuit nodes which have been declared to be tied high or low for the purpose of timing or other analysis. In block 121, the rules checker 100 determines, through the use of PathMill API calls, which nodes have been declared to be tied high or low, or are actually high or low because they are actual supply nodes. The rules checker 100 flags the actual high nodes as high and the actual low nodes as low in the step represented by block 121. In the step represented by block 122, the nodes which are actually supplies are flagged as supplies in the database.

The electrical rules checker 100 then obtains the number of gate-connected elements and the number of channel-connected elements from the static timing analyzer, as indicated by block 123. The electrical rules checker 100 also obtains the characteristics of the nodes from the static timing analyzer 10, as indicated by block 124. These characteristics include, for example, capacitance, node type, rise and fall time, etc. Once the characteristics of the node have been obtained, the electrical rules checker 100 obtains the pointers provided by the static timing analyzer 10 that point to each gate-connected element, as indicated by block 125. The electrical rules checker 100 then obtains the pointers from the static timing analyzer which point to each channel-connected element, as indicated by block 126.

The element pointers that are stored in the node during the steps represented by blocks 125 and 126 are pointers into the space of the static timing analyzer. Similarly, the node pointers that are stored in the element during the step represented by block 115 are pointers into the space of the static timing analyzer, except that the pointers to the VDD and GND nodes are stored as pointers to the VDD and GND nodes in the space of the electrical rules checker 100. In the step represented by block 127, some of these pointers are converted to point to the elements and nodes in the space of the electrical rules checker 100. For each of the gate-connected and channel-connected elements of the current node, the following steps are performed, which are represented by block 127:

(1) the element pointer is converted to the corresponding element pointer into the space of the electrical rules checker 100 by looking it up in the hash table. This element pointer replaces the original element pointer in the node structure;

(2) the source, gate, and drain pointers in the element data structure are each checked to see if they point to the current node. If so, the node pointer (into the space of the static timing analyzer) is replaced with the pointer to the current node in the space of the electrical rules checker.

A determination is then made at block 128 as to whether or not data structures for all of the nodes have been generated. If not, the next node in the netlist is obtained, as indicated by block 129, and the process returns to block 120.

Figure 3C:
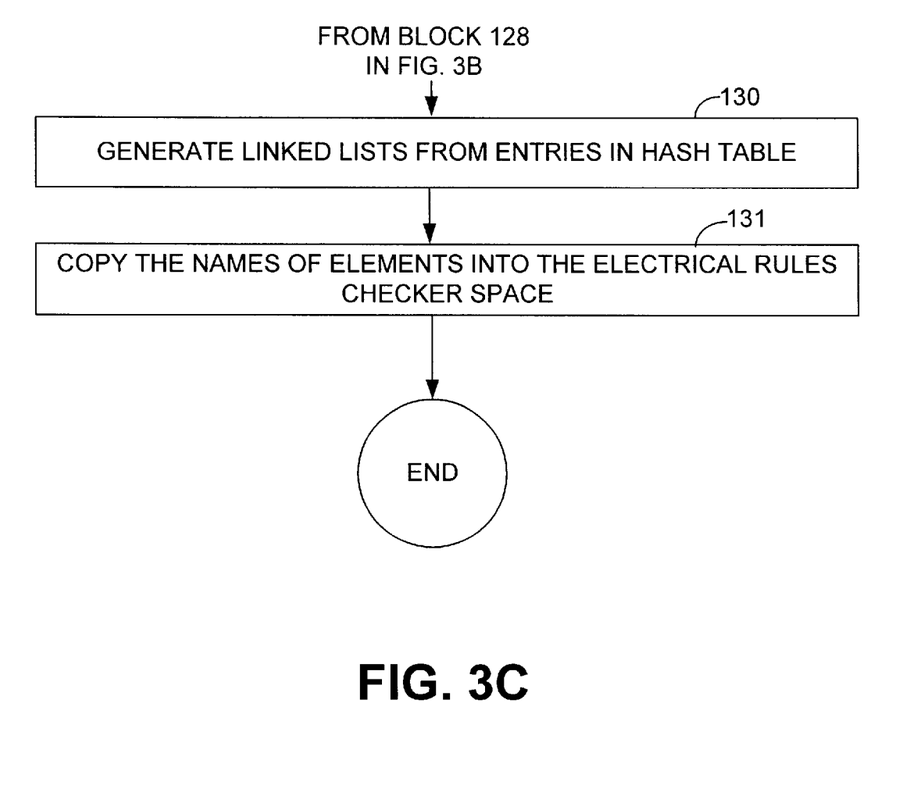

In order to enable the electrical rules checker 100 to maximize efficiency in searching the database of the present invention, once the data structures for all of the nodes have been created, linked lists of elements and nodes are generated from the entries in the hash table, as indicated by block 130 in FIG. 3C. These lists are used by the electrical rules checker 100 of the present invention in searching for an element in the database of the present invention. When searching for an element, the electrical rules checker 100 simply analyzes the elements contained in the linked list.

It should be noted that the arrangement of the elements and nodes in the linked lists may or may not have any physical relationship to the arrangement of the elements and nodes in the circuit under consideration. Thus, the linked lists are merely used to search through the elements and nodes stored in the database.

Once the linked lists have been generated, the names of the elements and nodes contained in the linked list are copied into electrical rules checker space, as indicated by block 131. This reduces the number of calls that need to be made to the PathMill program by the electrical rules checker 100. Once the database of the present invention has been generated, no more calls have to be made to the PathMill program via the PathMill API. The database of the present invention is comprised as the binary file 106 shown in FIG. 2.

Figure 4A:
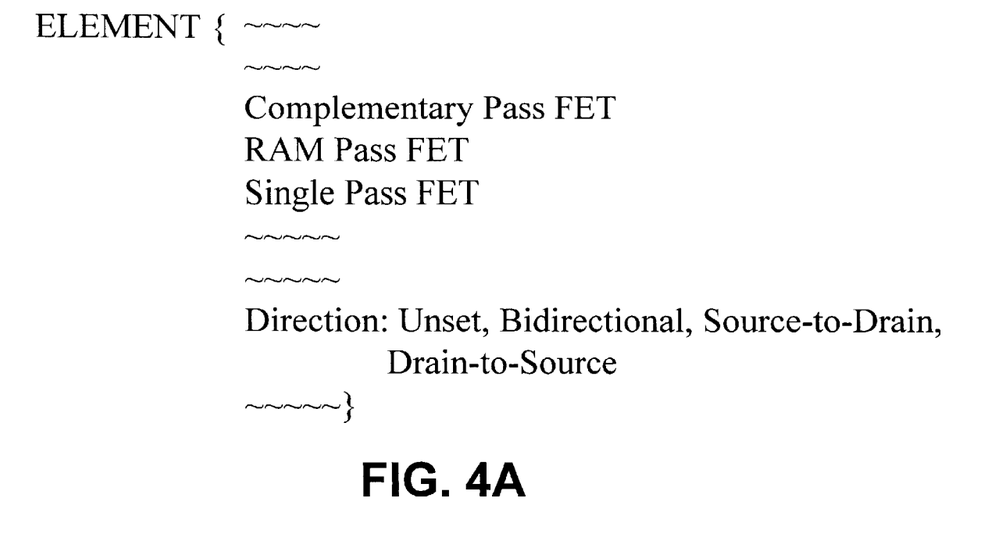
FIG. 4A is a diagram illustrating a portion of a data structure of a circuit element, depicting certain flags that may be set, in accordance with the invention.
Figure 4B:
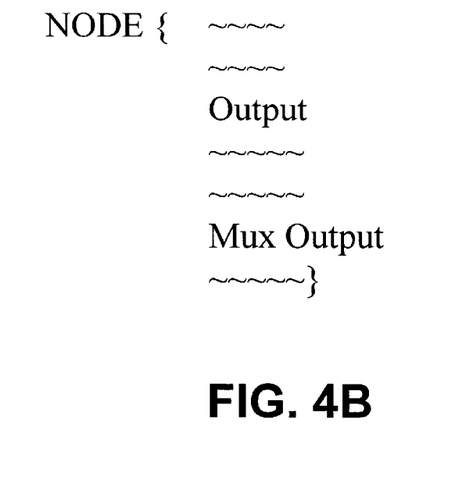
FIG. 4B is a diagram illustrating a portion of a data structure of a circuit node, depicting certain flags that may be set, in accordance with the invention.

The database that is generated may be structured so that various element and node features may be accessed via a data structure. Indeed, both an element data structure and a node data structure may be defined. As illustrated in FIG. 4A, the element data structure may define a large number of parameters (or flags), including whether the current element is a complementary pass FET, a RAM pass FET, a single pass FET, as well as direction flags (e.g., Unset, Bidirectional, Source-to-Drain, and Drain-to-Source). Similarly, a node data structure may be defined and include a number of flags, including a flag that indicates whether the node is an output node and another flag that indicates whether the node is a multiplexer output node.

Once the database of the present invention has been generated in the manner described above, the electrical rules checker 100 of the present invention utilizes this database to perform the rules checking tasks. As previously mentioned, one such task, and the one performed by the present invention is the identification of a circuit configuration that operates as a multiplexer. Specifically, the present invention detects circuit configurations that operate as multiplexers, to exempt such circuit configurations from error messages that are otherwise generated in response to an identification of multiple gates driving a common node.

Figure 5A:
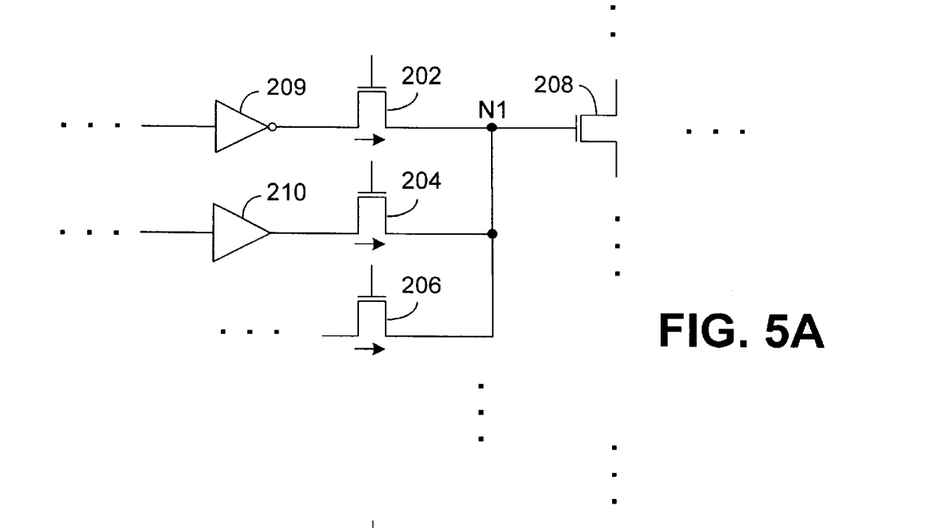
FIG. 5A is a schematic diagram illustrating a circuit configuration that is identified by the present invention as a multiplexer output.

Having described certain environmental and other background system information, the discussion will now be directed toward the inventive aspects of the present invention. In this regard, one aspect of the present invention is to provide a method for detecting pass FET devices from a netlist. To more particularly illustrate, reference is made to FIG. 5, which depicts a schematic diagram of a circuit configuration that is identified by the present invention as a multiplexer.

As previously mentioned, the system and method of the present invention makes certain assumptions regarding circuitry that is configured as a multiplexer. In this regard, the method of the present invention assumes that two or more pass FET devices, having differing inputs, configured to drive the same node as an output, will form part of a multiplexer. In the preferred embodiment of the present invention, the output node that is shared by the at least two pass FET devices will be marked in a data structure (see FIG. 4B) as a multiplexer output node.

FIG. 5A illustrates a portion of a larger integrated circuit including several FET devices 202, 204, 206, and 208. More particularly, NFET devices 202, 204, and 206 are configured and connected at common node N1. Arrows associated with each NFET device are each pointed in the direction toward N1. These arrows represent the direction of each NFET device 202, 204, and 206. The direction of a particular device, if set, may be obtained through PathMill, or by separately evaluating a netlist to make this determination. Once this determination is made, the direction of a given element may be stored in a direction flag of a data structure for a given element (see FIG. 4A). FIG. 5A further illustrates an inverter element 209 and a buffer element 210, each having an output that is connected to the input of NFET 202 and NFET 204, respectively. In accordance with the operation of the present invention, node N1 will be identified as an output node of the pass gate (i.e., FET 202). Furthermore, the present invention will identify two or more pass FET devices that are configured to drive a common output node.

In this regard, the arrows associated with each NFET device 202, 204, and 206 indicate that at least three pass FET devices are configured to drive a common node N1. Further, the present invention will identify, or verify, that the input to at least two of the pass FET devices that drive the comment output node N1 are not connected to the same node. In the particular embodiment illustrated FIG. 5A, the inputs to NFETs 202 and 204 are separately driven by inverter 209 and buffer 210. Accordingly, the inputs for the two NFETs 202 and 204 will be determined as not being driven by, or not sharing, a common node. Accordingly, node N1 will be marked in a node data structure (See FIG. 4B) as being an output node for a multiplexer device.

Therefore, if an electrical rules checking program were evaluating a netlist circuit design to identify potential design errors, where one such design error might be the simultaneous driving of a common node by two or more devices, rather than identify the circuit configuration of FIG. 5A as a potential error, the present invention may be used to identify the configuration as an output of a multiplexer. As a result, an electrical rules checking program may exempt this particular circuit configuration from generating an error message.

Figure 5B:
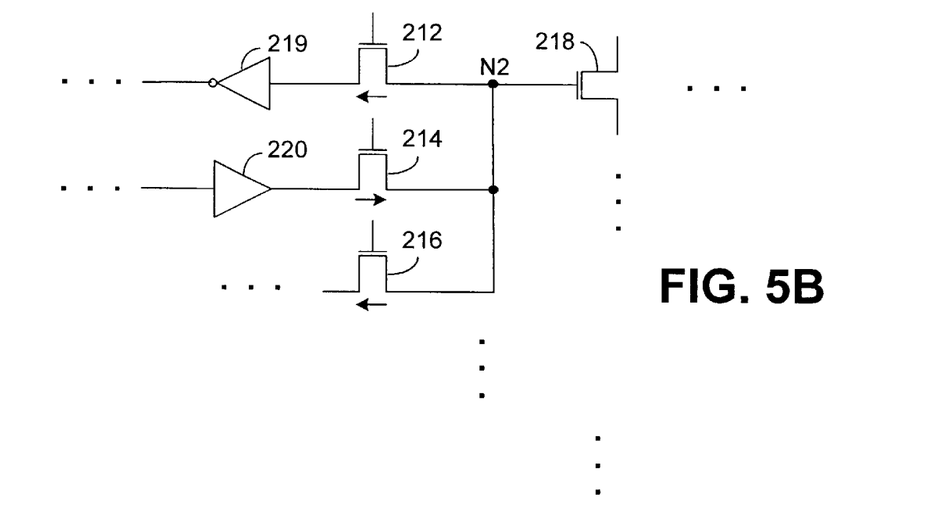
FIGS. 5B and 5C are schematic diagrams of similar circuit configurations that are not identified by the present invention as a multiplexer output.

In contrast, very similar circuit configurations may not be so identified (as a multiplexer) by the present invention. For example, and with reference to FIG. 5B, a circuit configuration very similar to that of FIG. 5A is shown. However, and different from that circuit configuration of 5A, two of the NFET devices to 212 and 216 have direction arrows pointing away from the common node N2. More specifically, FIG. 5B illustrates a portion of a circuit including four NFET devices 212, 214, 216, and 218. These NFET devices are configured much like the NFET devices in FIG. 5A. However, NFET devices to 212 and 216 have direction arrows set so that the output of those two FET devices are opposite node N2. Accordingly, when the present invention evaluates this portion (and more particularly node N2) it will not identify the circuit configuration as a multiplexer. Specifically, the present invention may properly identify node N2 as an output node. Indeed, node N2 is an output node for NFET 214. However, node N2 serves as an input node for FETs 212 and 216. Therefore, the present invention will not identify at least two pass FET devices configured to drive node N2, and therefore this circuit configuration will not satisfy the test of the present invention, as comprising a multiplexer circuit.

Figure 5C:
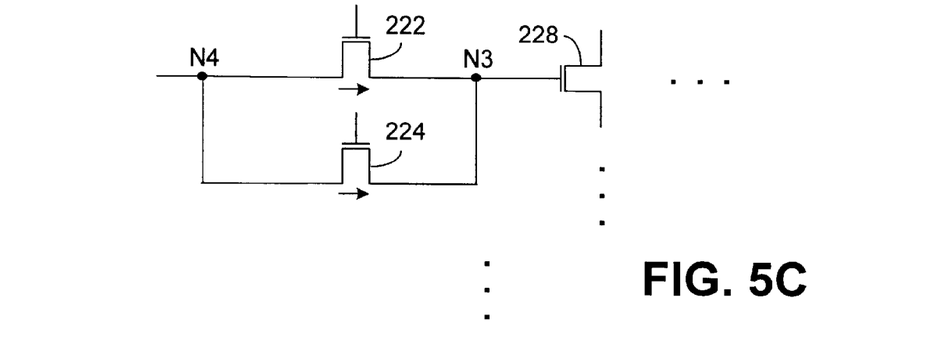

Reference is now made to FIG. 5C, which shows yet another example circuit. The circuit of FIG. 5C includes NFETs 222, 224, and 228. More particularly, the direction of NFETs 222 and 224 are set such that each drives node N3 as an output node. Accordingly, the present invention may identify NFETs 222 and 224 as pass FETs that each drive an output node. However, the input nodes of the two NFETs 222 and 224 are tied together. Accordingly, the circuit configuration of FIG. 5C would not be identified as a multiplexer output.

Figure 6:
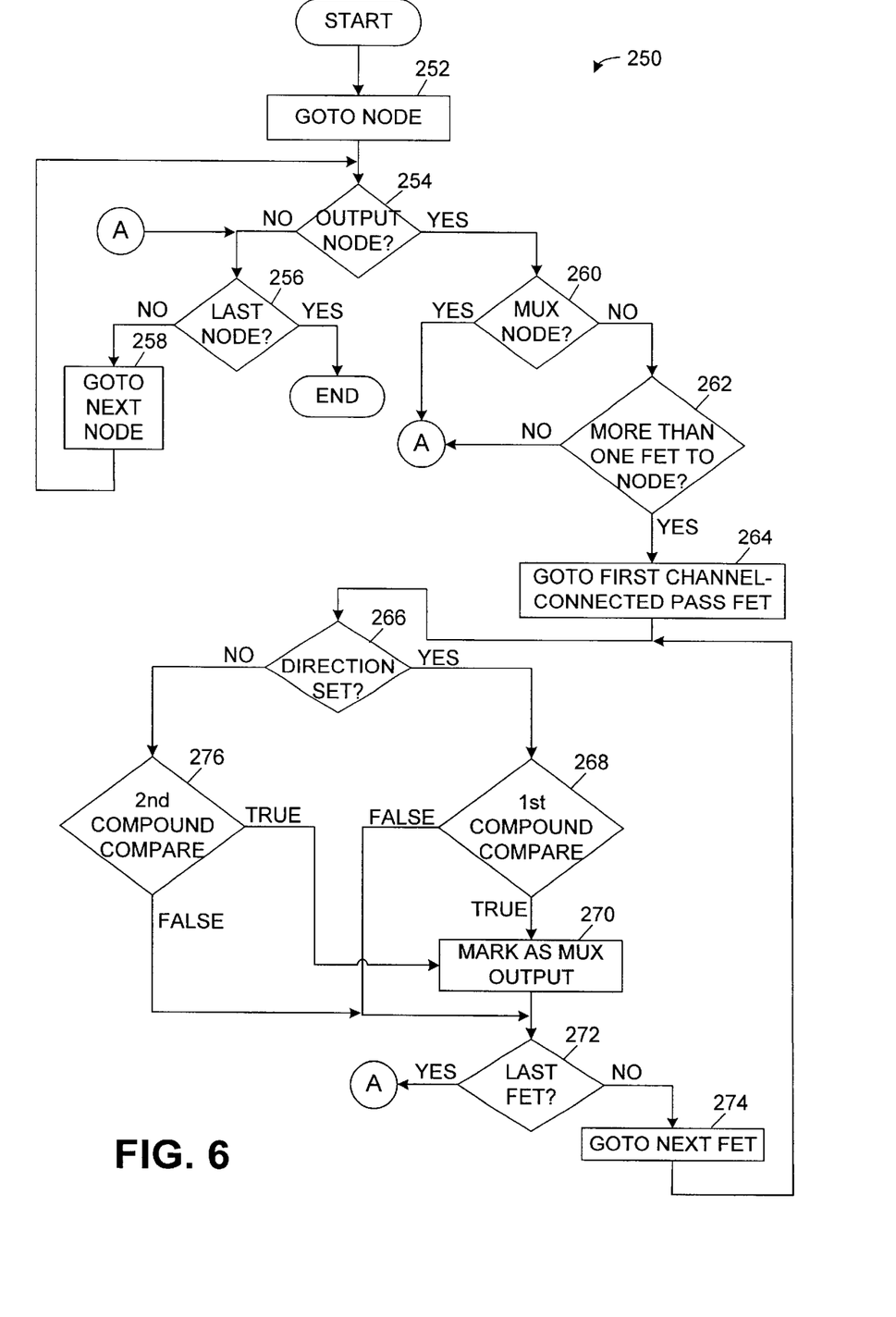
FIG. 6 is a flowchart depicting the principal functional steps in a method for identifying a circuit configuration as a multiplexer, in accordance with a preferred embodiment of the present invention.

Having illustrated very basic circuitry of what the present invention presumes to comprise a portion (an output portion) of a multiplexer circuit, reference is now made to FIG. 6 which is a flowchart 250 that illustrates the top level functional operation of a preferred embodiment of the present invention. In this regard, a preferred embodiment of the present invention may evaluate every node of a netlist file. In short, it may evaluate each node to determine first whether the node is an output node. For every output node, the present invention then determines whether at least two pass FET devices are configured to drive the output node, and further that those two pass FET devices do not share a common input node. If this basic test is satisfied, the present invention will identify the circuit configuration, and the output node more particularly, as a multiplexer circuit.

Having set forth this basic summary, and referring to the drawing, a first step (step 252) is denoted as "Goto Node." In this step, the method may simply go to a first node of a netlist, which may be a random node, as a starting point in the netlist file. The method then evaluates this node to determine whether the node is an output node (step 254). If not, then no further evaluation needs to be made on this node for purposes of the present invention. Thereafter, the method evaluates whether this node was the last node of the netlist file (step 256). If so, the routine ends. If, however, there are additional nodes in the netlist, then the method proceeds to the next node (step 258) and returns to step 254, where it determines whether that node is an output node.

As will be appreciated by those skilled in the art, a node may be determined to be an output node by evaluating the direction flags of the various elements that are channel-connected to that node, or by evaluating certain flags associated with the node. Such flags may be set by PathMill, by the system of the preferred embodiment, or in some other fashion, consistent with the concepts and teachings of the present invention. Since the manner in which a node may be determined to be an output node may vary, a detailed discussion of this aspect of the system and method of the preferred embodiment need not be provided herein.

If a given node is identified as an output node, then the present invention determines a whether this node has already been identified as a multiplexer output node (step 260). It may do this by evaluating a data structure element (e.g., flag) of a node data structure, specifying whether a given node is a multiplexer output node. If so, no further computation or evaluation must be made on this node, and the method may return to step 256 and proceed as previously described. Assuming, however, that the current output node has not been previously marked as a multiplexer output, then the method of the preferred embodiment determines whether more than one FET is channel connected to the node (step 262). If not, no further evaluation of this node needs to be made, the since a multiplexer output will have multiple FET devices that are channel connected thereto. If the test of step 262 results to YES, then the method loops on each of the FETs that are channel connected to the output node.

More specifically, the method will proceed to a first pass FET device that is channel connected to the current output node (step 264). The method will then determine whether the direction of that FET has previously been set (step 266). This step may be performed by evaluating a direction flag that is stored within an element data structure (see FIG. 4A). Indeed, in the preferred embodiment of the invention, this is the manner in which step 266 is carried out. Alternatively, and consistent with the concepts and teachings of the present invention, the method may make this determination by performing more sophisticated evaluations of the netlist circuitry. Based upon whether or not the direction of a given FET has been set, the method will proceed in two different fashions. Furthermore, and in regard to the direction flags a FET being set, it should be appreciated that the direction of a FET device may be set as either "source to drain" or "drain to source".

If the direction of a given FET is determined to be set, then the method of the preferred embodiment performs a first compound comparison. Specifically that comparison may be implemented as follows: "IF the output channel of the pass FET is the same node as the output node of the comparison FET (loop FET) AND if the input channel of the pass FET is not the same node as the input channel of the comparison FET AND the comparison FET is a pass FET, THEN the comparison output is TRUE."

It should be appreciated that alternative comparisons, or alternative methods of implementing this comparison may be implemented, consistent with the scope and spirit of the present invention. For example, in one implementation, pass FETs may be grouped broadly (as implied above), and any pass FET that satisfies the comparison may be treated accordingly. In an alternative implementation, pass FETs may be categorized and separately evaluated in accordance with the comparison. For example, pass FETs may be categorized as single pass FETs, RAM pass FETs, or complementary pass FETs. The comparison may, then, be category specific (i.e., separately made for each category of pass FET). Thus, in accordance with such an implementation, if a RAM pass FET and a single pass FET shared a common output node but had different input nodes, the comparison would resolve to FALSE, instead of TRUE (i.e., both pass FETs would either have to be RAM pass FETs, single pass FETs, or complementary pass FETs). The structure, nature, and identification of these various types of pass FETs is described in the commonly assigned U.S. patent applications Ser. No. 09/273,784, filed on Mar. 22, 1999, and Ser. No. 09/273,631, filed on Mar. 23, 1999, which are hereby incorporated by reference in their entirety.

In keeping with the description of FIG. 6, if the first compound comparison resolves to TRUE, then the present invention assumes that the current output node is an output node of a multiplexer, and it marks a appropriate flag in a data structure for the current output node (step 270). The method of the present invention may then proceed to the next node in the netlist file. Alternatively, if the first compound-comparison does not resolve to TRUE (step 268) then the method proceeds to step 272, where it evaluates whether the current FET is the last FET that is channel connected to the current output node. If not, the method proceeds to the next channel connected FET (step 272 and returns to step 266) to continue processing as described above. If, however, the last evaluated FET was the last FET that is channel connected to the current output node, then the present invention returns to step 256 for further processing.

If step 266 resolves to NO (i.e., the direction of a given FET has not been set) then the method of the preferred embodiment proceeds to step 276 where it performs a second compound comparison. Specifically, the second compound comparison is as set forth as follows: "(IF the drain of the pass FET is the same node as the drain of the comparison FET, AND the source of the comparison FET is not the same node as the source of the pass FET) OR (the source of the pass FET is the same node as the source of the comparison FET, AND the drain of the comparison FET is not the same node as the drain of the pass FET) AND the comparison FET is a pass FET, then the comparison output is TRUE."

Again, and as mentioned in connection with the first comparison, this second comparison may be implemented in a variety of ways. In one implementation, pass FETs may be grouped broadly (as implied above), and any pass FET that satisfies the comparison may be treated accordingly. In an alternative implementation, pass FETs may be categorized and separately evaluated in accordance with the comparison.

If the evaluation of the second compound comparison results to YES, then the method proceeds to step 270, where it marks the current output node has a multiplexer output node and proceeds in the manner described above. Otherwise, the method proceeds to step 272, and again proceeds in the manner described above.

Having described the method of the present invention, it will be appreciated that the steps illustrated in the flow chart of FIG. 6 is provided for purposes of illustration and is not deemed to be limiting on the broader aspects of the present invention. Indeed, the broader aspects of the present invention may be implemented using a variety of different approaches that are still consistent with the scope and content of the present invention. As illustrated in FIG. 2, a portion 102 of the electrical rules checker program 100 of the present invention i s configured to detect circuit configurations that operate as multiplexers. In accordance with this broader aspect, a system may be provided for detecting such multiplexer configurations. In the preferred embodiment, the system comprises software which may be provided on a computer readable storage medium in a form of code segments that are particularly configured to perform various functions.

Figure 7:
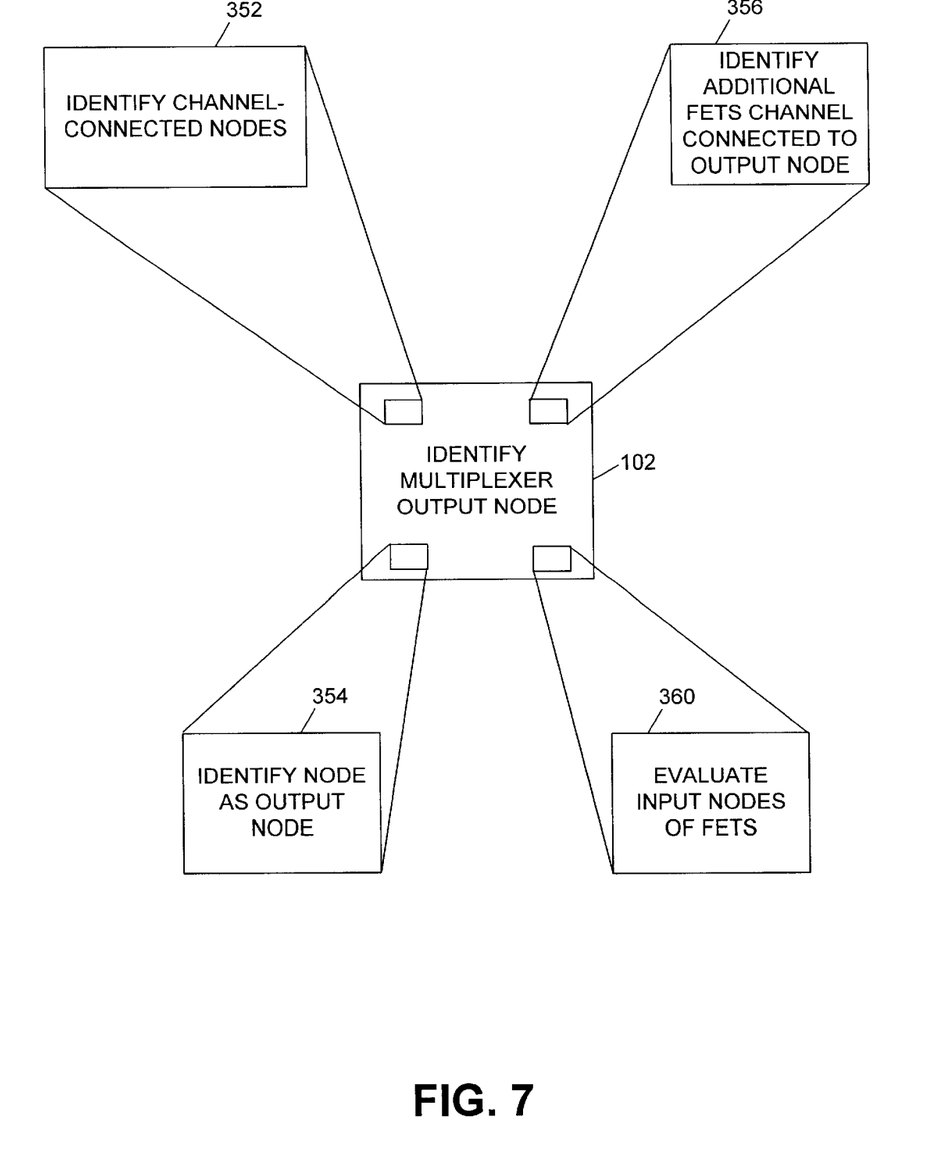
FIG. 7 is a block diagram illustrating certain fundamental code segments comprising a system constructed in accordance with the invention.

In this regard, reference is now made to FIG. 7 which illustrates certain functions which may be carried out by a system constructed in accordance with the teachings of the invention. For example, the code segment 102 may comprise a plurality of code segments including a segment 352 for identifying nodes that are channel connected. Another segment 354 may be provided for identifying a given node as an output node. Yet another segment 356 may be configured to identify additional FETs that are channel connected to the output node. Still another segment 360 may be configured to evaluate input nodes of the various FETs that are channel connected to the output node. Yet additional segments (not illustrated) may be provided in connection with the system of the present invention, as will be appreciated by persons of skill in the art in light of the teachings provided herein.

It should be appreciated that the flow chart of FIG. 6 shows the top-level operation of only one possible implementation of the methods of the present invention. In this regard, each block represents a module, segment, or portion of code, which comprises one or more executable instructions for implementing the specified logical function(s). It should also be noted that in some alternative implementations, the functions noted in the blocks may occur out of the order noted in FIG. 6. For example, two blocks shown in succession may in fact be executed substantially concurrently or the blocks may sometimes be executed in the reverse order, depending upon the functionality involved.

The foregoing description is not intended to be exhaustive or to limit the invention to the precise forms disclosed. Obvious modifications or variations are possible in light of the above teachings. In this regard, the embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. A method for identifying a circuit configured as a multiplexer by evaluating a netlist comprising the steps of:

identifying both an input node and an output node of a pass gate;

identifying all FETs that are channel connected to the output node;

evaluating all FETs that are identified as being channel connected to the output node, to determine whether they are pass FETs; and determining whether at least one of the identified pass FETs has an output that is the same node as the output node and an input that is not the same node as the input node.

2. The method as defined in claim 1, wherein the step of evaluating all FETs that are identified as being channel connected to the output node includes evaluating an item in a data structure that has been predetermined and stored in the data structure.

3. The method as defined in claim 1, wherein the step of evaluating all FETs that are identified as being channel connected to the output node includes evaluating each FET to determine whether a direction of each has been set.

4. The method as defined in claim 1, wherein the step of evaluating all FETs that are identified as being channel connected to the output node includes evaluating each FET to determine a second input node and a second output node of the each FET.

5. The method as defined in claim 4, wherein the step of evaluating all FETs that are identified as being channel connected to the output node further includes the step of evaluating other elements that are channel connected to the second input node to identify at least one of the other elements that drives the second input node.

6. The method as defined in claim 1, wherein the step of determining whether at least one of the identified pass FETs has an output that is the same node as the output node and an input that is not the same node as the input node, further includes the step of determining whether a direction flag of the pass FET is set.

7. The method as defined in claim 1, further including the step of marking the output node in a data structure as being the output node of a multiplexer.

8. The method as defined in claim 7, wherein the step of marking the output node in a data structure more specifically includes setting a bit in the data structure.

9. The method as defined in claim 1, wherein the step of identifying an input node and an output node of a pass gate, further includes the step of determining whether a current element is a pass gate.

10. The method as defined in claim 1, wherein the step of determining whether a current element is a pass gate includes determining whether the current element is an element selected from the group consisting of: a complementary pass FET, and a single pass FET.

11. A method for identifying a circuit configured as a multiplexer by evaluating a netlist comprising the steps of:

identifying a node in the netlist that is an output node of a first pass FET;

identifying at least one other pass FET that has an output that is the same node as the output node; and evaluating the at least one other pass FET to determine whether an input of that other at least one other pass FET is not the same node as an input node of the first pass FET.

12. The method as defined in claim 11, wherein the step of evaluating at least one pass FET includes evaluating each FET to determine a second input node and a second output node of the each FET.

13. The method as defined in claim 12, wherein the step of evaluating at least one pass FET further includes the step of evaluating other elements that are channel connected to the second input node to identify at least one of the other elements that drives the second input node.

14. The method as defined in claim 11, further including the step of marking the output node in a data structure as being the output node of a multiplexer.

15. A computer readable medium containing program code for controlling a system to identify a circuit configured as a multiplexer by evaluating a netlist comprising:

a first code segment configured to identify a node in the netlist that is an output node of a first pass FET;

a second code segment configured to identify at least one other pass FET that has an output that is the same node as the output node; and a third code segment configured to evaluate the at least one other pass FET to determine whether an input of that other at least one other pass FET is not the same node as an input node of the first pass FET.

16. The computer readable medium as defined in claim 15, wherein the segment configured to evaluate at least one pass FET further includes a segment configured to evaluate each FET to determine a second input node and a second output node of the each FET.

17. The computer readable medium as defined in claim 16, wherein the segment configured to evaluate at least one pass FET further includes a segment configured to evaluate other elements that are channel connected to the second input node to identify at least one of the other elements that drives the second input node.

18. The computer readable medium as defined in claim 15, further including a segment configured to mark the output node in a data structure as being the output node of a multiplexer.

* * * * *